United States Patent
Choi et al.

(10) Patent No.: US 9,960,387 B2
(45) Date of Patent: May 1, 2018

(54) METHOD FOR MANUFACTURING LIGHT EXTRACTION SUBSTRATE FOR ORGANIC LIGHT-EMITTING ELEMENT, LIGHT EXTRACTION SUBSTRATE FOR ORGANIC LIGHT-EMITTING ELEMENT, AND ORGANIC LIGHT-EMITTING ELEMENT COMPRISING SAME

(71) Applicant: Corning Precision Materials Co., Ltd., Chungcheongnam-do (KR)

(72) Inventors: Eun Ho Choi, Chungcheongnam-do (KR); Seo Hyun Kim, Chungcheongnam-do (KR); Joo Young Lee, Chungcheongnam-do (KR)

(73) Assignee: Corning Precision Materials Co., Ltd. (KR)

( * ) Notice: Subject to any disclaimer, the term of this patent is extended or adjusted under 35 U.S.C. 154(b) by 0 days. days.

(21) Appl. No.: 15/538,524

(22) PCT Filed: Dec. 16, 2015

(86) PCT No.: PCT/KR2015/013798
§ 371 (c)(1),
(2) Date: Jun. 21, 2017

(87) PCT Pub. No.: WO2016/105018
PCT Pub. Date: Jun. 30, 2016

(65) Prior Publication Data
US 2017/0352840 A1    Dec. 7, 2017

(30) Foreign Application Priority Data
Dec. 22, 2014    (KR) .................. 10-2014-0185962

(51) Int. Cl.
*H01L 51/52*    (2006.01)
*H01L 51/56*    (2006.01)

(52) U.S. Cl.
CPC ...... *H01L 51/5268* (2013.01); *H01L 51/5203* (2013.01); *H01L 51/5237* (2013.01); *H01L 51/5275* (2013.01); *H01L 51/56* (2013.01)

(58) Field of Classification Search
CPC ............. H01L 51/5268; H01L 51/5203; H01L 51/5237; H01L 51/5275; H01L 51/56
See application file for complete search history.

(56) References Cited

U.S. PATENT DOCUMENTS

2011/0007903 A1    1/2011    Robert et al.
2011/0148286 A1    6/2011    Ju
(Continued)

FOREIGN PATENT DOCUMENTS

KR    101093259 B1    12/2011
KR    20120005414    1/2012
(Continued)

OTHER PUBLICATIONS

International Search Report for PCT/KR2015/013798 dated Mar. 31, 2016.

Primary Examiner — Karen Kusumakar
(74) Attorney, Agent, or Firm — Lerner, David, Littenberg, Krumholz & Mentlik, LLP

(57) ABSTRACT

The present invention relates to a method for manufacturing a light extraction substrate for an organic light-emitting element, a light extraction substrate for an organic light-emitting element and an organic light-emitting element comprising the same and, more specifically, to: a method for manufacturing a light extraction substrate for an organic light-emitting element, the method being capable of improving light extraction efficiency of the organic light-emitting element and also increasing luminance uniformity; a light extraction substrate for an organic light-emitting element; and an organic light-emitting element comprising the same. To this end, the present invention provides a method for
(Continued)

manufacturing a light extraction substrate for an organic light-emitting element, comprising: a mixture preparation step of preparing a mixture by mixing a plurality of scattering particles with an inorganic binder; a mixture coating step of coating the mixture on a base substrate; a buffer layer formation step of forming a buffer layer by coating an inorganic material on the coated mixture; a calcination step of calcinating the mixture and the buffer layer; a first electrode formation step of forming a first electrode, which is made of a metal, in a crack formed in the mixture and the buffer layer in the calcination step; and a second electrode formation step of forming, on the first electrode, a second electrode electrically connected to the first electrode.

18 Claims, 5 Drawing Sheets

(56) References Cited

U.S. PATENT DOCUMENTS

| | | | |
|---|---|---|---|
| 2013/0020550 A1 | 1/2013 | Reddy | |
| 2013/0082368 A1* | 4/2013 | Kim | H01L 23/552 257/659 |
| 2013/0286659 A1* | 10/2013 | Lee | H01L 51/0096 362/326 |
| 2014/0048788 A1 | 2/2014 | Lee et al. | |

FOREIGN PATENT DOCUMENTS

| | | |
|---|---|---|
| KR | 101114917 B1 | 2/2012 |
| KR | 20130035620 A | 4/2013 |
| WO | 2010024652 A2 | 3/2010 |

* cited by examiner

METHOD FOR MANUFACTURING LIGHT EXTRACTION SUBSTRATE FOR ORGANIC LIGHT-EMITTING ELEMENT, LIGHT EXTRACTION SUBSTRATE FOR ORGANIC LIGHT-EMITTING ELEMENT, AND ORGANIC LIGHT-EMITTING ELEMENT COMPRISING SAME

CROSS-REFERENCE TO RELATED APPLICATION

This application is a national phase entry under 35 U.S.C. § 371 of International Application No. PCT/KR2015/013798, filed on Dec. 16, 2015, published in Korean, which claims priority to Korean Patent Application No. 10-2014-0185962, filed on Dec. 22, 2014, the disclosures of which are incorporated herein by reference.

TECHNICAL FIELD

The present disclosure relates to a method of manufacturing a light extraction substrate for an organic light-emitting device or an organic light-emitting diode (OLED) device, a light extraction substrate for an OLED device, and an OLED device including the same. More particularly, the present disclosure relates to a method of manufacturing a light extraction substrate for an OLED device, a light extraction substrate for an OLED device, and an OLED device including the same, in which not only the light extraction efficiency, but also the luminance uniformity of the OLED device, is improved.

BACKGROUND ART

In general, light-emitting devices may be divided into organic light-emitting diode (OLED) devices having a light-emitting layer formed from an organic material and inorganic light-emitting devices having a light-emitting layer formed from an inorganic material. In OLED devices, OLEDs are self-emitting light sources based on the radiative decay of excitons generated in an organic light-emitting layer by the recombination of electrons injected through an electron injection electrode (cathode) and holes injected through a hole injection electrode (anode). OLEDs have a range of merits, such as low-voltage driving, self-emission, a wide viewing angle, high resolution, natural color reproducibility, and rapid response times.

Recently, research has been actively undertaken into applying OLEDs to portable information devices, cameras, clocks, watches, office equipment, information display devices for vehicles or similar, televisions (TVs), display devices, lighting systems, and the like.

To improve the luminous efficiency of such above-described OLED devices, it is necessary to improve the luminous efficiency of a material of which a light-emitting layer is formed or light extraction efficiency, i.e. the efficiency with which light generated by the light-emitting layer is extracted.

The light extraction efficiency of an OLED device depends on the refractive indices of OLED layers. In a typical OLED device, when a beam of light generated by the light-emitting layer is emitted at an angle greater than a critical angle, the beam of light may be totally reflected at the interface between a higher-refractivity layer, such as a transparent electrode layer functioning as an anode, and a lower-refractivity layer, such as a glass substrate. This may consequently lower light extraction efficiency, thereby lowering the overall luminous efficiency of the OLED device, which is problematic.

Described in more detail, only about 20% of light generated by an OLED is emitted from the OLED device and about 80% of the light generated is lost due to a waveguide effect originating from different refractive indices of a glass substrate, an anode, and an organic light-emitting layer comprised of a hole injection layer, a hole transport layer, an emissive layer, an electron transport layer, and an electron injection layer, as well as by the total internal reflection originating from the difference in refractive indices between the glass substrate and ambient air. Here, the refractive index of the internal organic light-emitting layer ranges from 1.7 to 1.8, whereas the refractive index of indium tin oxide (ITO), generally used in anodes, is about 1.9. Since the two layers have a significantly low thickness, ranging from 200 nm to 400 nm, and the refractive index of the glass used for the glass substrate is about 1.5, a planar waveguide is thereby formed inside the OLED device. It is calculated that the ratio of the light lost in the internal waveguide mode due to the above-described reason is about 45%. In addition, since the refractive index of the glass substrate is about 1.5 and the refractive index of ambient air is 1.0, when light exits the interior of the glass substrate, a beam of the light, having an angle of incidence greater than a critical angle, may be totally reflected and trapped inside the glass substrate. The ratio of trapped light is about 35%. Therefore, only about 20% of generated light may be emitted from the OLED device.

To overcome such problems, light extraction layers, through which 80% of light that would otherwise be lost in the internal waveguide mode can be extracted, have been actively researched. Light extraction layers are generally categorized as internal light extraction layers and external light extraction layers. In the case of external light extraction layers, it is possible to improve light extraction efficiency by disposing a film including microlenses on the outer surface of the substrate, the shape of the microlenses being selected from a variety of shapes. The improvement of light extraction efficiency does not significantly depend on the shape of microlenses. On the other hand, internal light extraction layers directly extract light that would otherwise be lost in the light waveguide mode. Thus, the capability of internal light extraction layers to improve light extraction efficiency may be higher than that of external light extraction layers.

A conventional process for manufacturing an internal light extraction layer includes scattering particles are mixed with a sol of an inorganic binder that fixes the scattering particles to a substrate, coating the substrate with the scattering particles, and firing the scattering particles on the substrate. However, due to volumetric contraction caused by the crystallization of the sol of the binder material during the firing operation and the process of relieving stress caused by the difference in coefficients of thermal expansion (CTE) between the substrate and the binder material, fine cracks may be formed in the coating film. Since the cracks increase the surface roughness of the coating film while reducing the bonding force of the coating film, the top surface of the coating film must be additionally coated with a planarization film, thereby incurring the cost of additional processing, which is problematic.

In the fabrication of an OLED device having a large area, an auxiliary metal electrode is necessary in addition to a main electrode, an anode, for the purpose of luminous uniformity and to enable low-voltage driving. In the related art, the auxiliary electrode is formed by photolithographic patterning. However, when the auxiliary electrode is formed in such a photolithographic process, the cost of processing may be significantly increased, which is problematic. In addition, the auxiliary electrode can be formed using a printing method. However, when the auxiliary electrode is formed by the printing method, a minimum line width and height of the auxiliary electrode may range from tens of micrometers to hundreds of micrometers, such that the opening ratio thereof may be reduced. The electrical properties of the auxiliary electrode formed by such a printing method are inferior to those of auxiliary electrodes formed by deposition.

RELATED ART DOCUMENT

Korean Patent No. 1093259 (Dec. 6, 2011)

DISCLOSURE

Technical Problem

Accordingly, the present disclosure has been made in consideration of the above-described problems occurring in the related art, and the present disclosure proposes a method of manufacturing a light extraction substrate for an organic light-emitting device or an organic light-emitting diode (OLED) device, a light extraction substrate for an OLED device, and an OLED device including the same, in which not only the light extraction efficiency, but also the luminance uniformity of the OLED device, is improved.

Technical Solution

According to an aspect of the present disclosure, provided is a method of manufacturing a light extraction substrate for an OLED device. The method may includes: preparing a mixture by mixing a number of scattering particles with an inorganic binder; coating a base substrate with the mixture; forming a buffer layer by coating the mixture on the base substrate with an inorganic material; firing the mixture and the buffer layer; forming a first electrode from metal in cracks formed in the mixture and the buffer layer during the firing; and forming a second electrode on the first electrode to be electrically connected to the first electrode.

The number of scattering particles used in preparing the mixture may be particles having a difference in refractive index of 0.3 or greater than the inorganic binder.

The number of scattering particles used in preparing the mixture may be one metal oxide or a combination of two or more metal oxides selected from a candidate group consisting of $SiO_2$, $TiO_2$, ZnO, and $SnO_2$.

In preparing the mixture, scattering particles respectively including a core and a shell surrounding the core, the shell having a refractive index different from a refractive index of the core, may be used as the number of scattering particles or to form portions of the number of scattering particles.

In preparing the mixture, the scattering particles respectively including a hollow core may be used as the number of scattering particles or to form portions of the number of scattering particles.

The inorganic material forming the buffer layer may be ZnO.

Forming the first electrode may include: depositing metal within the cracks and on the buffer layer; and etching the buffer layer.

The deposited metal may be one metal selected from a candidate group consisting of Cu, Al, and Ag.

Firing the mixture may form a number of voids having irregular shapes within the matrix layer.

According to another aspect of the present disclosure, provided is a light extraction substrate for an OLED device. The light extraction substrate may include: a base substrate; a matrix layer disposed on the base substrate; a number of scattering particles dispersed within the matrix layer; a first electrode filling cracks formed in the matrix layer and formed from metal; and a second electrode disposed on the matrix layer and the first electrode.

The number of scattering particles may be particles having a difference in refractive index of 0.3 or greater than the matrix layer.

At least portions of the number of scattering particles may respectively include a core and a shell surrounding the core, the shell having a refractive index different from a refractive index of the core.

The cores may be voids.

The light extraction substrate may further include voids having irregular shapes disposed within the matrix layer.

The cracks may be disposed between the number of scattering particles or between clusters of several scattering particles of the number of scattering particles.

At least portions of the cracks may expose the base substrate to a surface of the matrix layer.

The second electrode may be a transparent electrode functioning as a main electrode of the OLED device, the first electrode may function as an auxiliary electrode of the OLED device, and the matrix layer and the number of scattering particles may function as an internal light extraction layer of the OLED device.

According to another aspect of the present disclosure, an OLED device may include the above-described light extraction substrate in a location through which generated light exits.

Advantageous Effects

According to the present disclosure, an electrode supposed to function as an auxiliary electrode of an OLED device is manufactured by forming a random network structure by controlling the shape of cracks formed, without additional processing, due to the difference in coefficients of thermal expansion (CTE) between a mixture and a base substrate during contraction of the mixture for forming a matrix layer and then depositing metal in the cracks. When applied to the OLED device, it is possible to improve the light extraction efficiency and luminance uniformity of the OLED device and enable the OLED device to operate at a low voltage. Accordingly, the present disclosure is applicable to the OLED device having a large area.

In addition, according to the present disclosure, the electrode is formed by filling cracks that are formed without additional processing. The electrode can be formed in a simpler manner than a conventional process in which the auxiliary electrode of the OLED device is formed by photolithography, thereby reducing fabrication costs of the OLED device.

Furthermore, according to the present disclosure, a conductive film supposed to function as a transparent electrode of an OLED device is formed to cover the surface of the auxiliary electrode formed in the cracks and the surface of the matrix layer. Then, the surface of the matrix layer, the roughness of which is increased by the occurrence of the cracks, can be planarized. This can consequently remove an additional process for forming a planarization layer, thereby reducing fabrication costs of the OLED device.

In addition, according to the present disclosure, when the auxiliary electrode is formed by filling the cracks formed in the matrix layer, the probability that light, wave-guided sideways from the inside of the matrix layer, will arrive at and be reflected from the auxiliary electrode formed from metal is increased. This can consequently disturb a waveguide mode, thereby leading to an improvement in the light extraction efficiency.

MODE FOR INVENTION

Hereinafter, a method of manufacturing a light extraction substrate for an organic light-emitting device or an organic light-emitting diode (OLED) device, a light extraction substrate for an OLED device, and an OLED device including the same according to exemplary embodiments will be described in detail with reference to the accompanying drawings.

In the following description, detailed descriptions of known functions and components incorporated herein will be omitted in the case in which the subject matter of the present disclosure may be rendered unclear by the inclusion thereof.

A method of manufacturing a light extraction substrate for an organic light-emitting device or an OLED device according to an exemplary embodiment is a method of manufacturing a light extraction substrate (100 in FIG. 9) that is disposed on a path, along which light emitted by an OLED of an OLED device (10 in FIG. 9) exits, to function as a route through which light emitted by the OLED can pass, improve the light extraction efficiency of the OLED device 10, and protect the OLED from the external environment.

Figure 1:
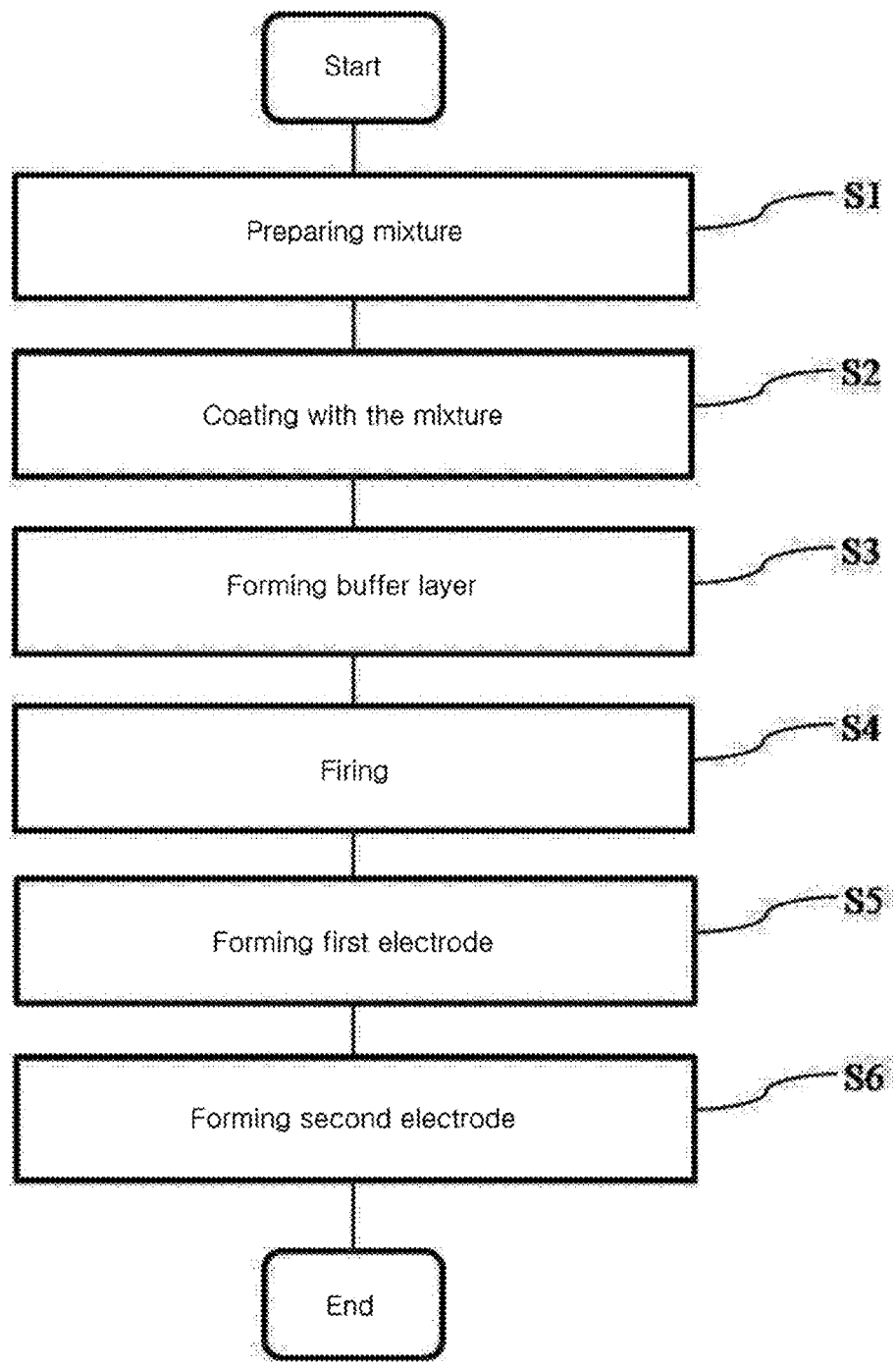
FIG. 1 is a process flowchart illustrating a method of manufacturing a light extraction substrate for an OLED device according to an exemplary embodiment.

As illustrated in FIG. 1, the method of manufacturing a light extraction substrate for an OLED device according to the exemplary embodiment includes a mixture preparation step S1, a mixture coating step S2, a buffer layer forming step S3, a firing step S4, a first electrode forming step S5, and a second electrode forming step S6.

First, the mixture preparation step S1 is a step of preparing a mixture (120 in FIG. 2) that is supposed to form an internal light extraction layer of the OLED device 10. In the mixture preparation step S1, the mixture 120 is made by mixing a sol of an inorganic binder (121 in FIG. 2) with a number of scattering particles (122 in FIG. 2). Here, the inorganic binder 121 and the scattering particles 122, used in the mixture preparation step S1, may have different refractive indices, such that the mixture improves the light extraction efficiency of the OLED device 10 when used for the internal light extraction layer of the OLED device 10. For example, in the mixture preparation step S1, the refractive index of the scattering particles 122 used may differ by 0.3 or more from the refractive index of the inorganic binder 121 supposed to form a matrix layer (140 in FIG. 5) of the scattering particles 122. Here, in the mixture preparation step S1, the scattering particles 122 may be one metal oxide or a combination of two or more metal oxides selected from a candidate group consisting of $SiO_2$, $TiO_2$, ZnO, and $SnO_2$. In addition, in the mixture preparation step S1, a number of scattering particles used as the number of scattering particles 122 to be mixed with the inorganic binder 121 may respectively be composed of a core (123 in FIG. 2) and a shell (124 in FIG. 2) surrounding the core, the shell having a refractive index different from that of the core. In addition, in the mixture preparation step S1, the scattering particles having the core-shell structure may be used to form portions of the number of scattering particles 122 to be mixed with the inorganic binder 121. In the scattering particles used in the mixture preparation step S1, the cores 123 may be hollow portions. Specifically, in the mixture preparation step S1, a single type of scattering particles selected from among typical single-refractive-index scattering particles formed from a single material, the core-shell structure scattering particles in which the refractive index of the cores 123 is different from the refractive index of the shells 124, and the core-shell structure scattering particles in which the cores 123 are hollow portions, may be used as the number of scattering particles 122 to be mixed with the inorganic binder 121. Alternatively, two or more of the referred particles may be mixed at predetermined ratios to be used as the number of scattering particles 122 to be mixed with the inorganic binder 121. As described above, the number of scattering particles 122 able to have a variety of combinations scatter light emitted from the OLED along a variety of, or complicated, paths, thereby functioning to improve the light extraction efficiency of the OLED device 10. In particular, when the scattering particles 122 have the core-shell structure having multiple refractive indices, the different refractive indices of the cores 123 and the shells 124 can further improve the efficiency of the OLED device 10 for extracting light emitted from the OLED.

In the subsequent firing step S4, the mixture 120 is formed as a matrix layer (140 in FIG. 5) in which the number of scattering particles 122 are dispersed. Here, due to a difference in coefficients of thermal expansion (CTE) between a base substrate (110 in FIG. 2) and the inorganic binder 121, cracks (141 in FIG. 5) are formed without additional processing. In the mixture preparation step S1 according to the exemplary embodiment, the composition and concentration of the mixture 120 can be adjusted to control the cracks 141 to have random network structures. For example, in the mixture preparation step S1, the scattering particles 122 including $SiO_2$ can be mixed in an amount of 1.0M or more with the inorganic binder 121 including $TiO_2$.

Figure 2:
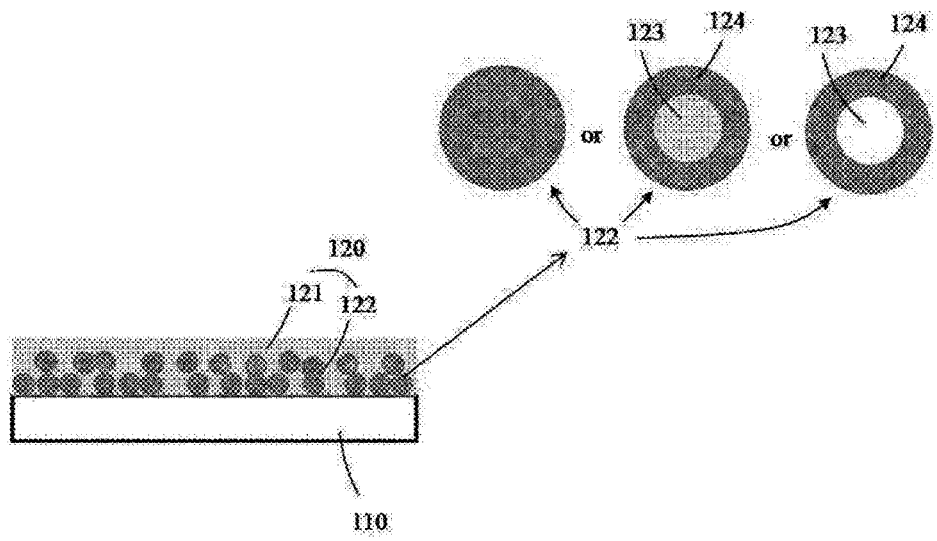
FIG. 2 to FIG. 8 are schematic process views sequentially illustrating the method of manufacturing a light extraction substrate for an OLED device according to the exemplary embodiment.

Afterwards, as illustrated in FIG. 2, the mixture coating step S2 is a step of coating the top surface of the base substrate 110 with the mixture 120 made in the mixture preparation step S1. In the mixture coating step S2, the mixture 120 may be applied to the top surface of the base substrate 110 to a thickness equal to or higher than the thickness of the scattering particles 122, so that the difference in CTEs between the base substrate 110 and the inorganic binder 121 causes the cracks (141 in FIG. 5) to be formed in the matrix layer (140 in FIG. 5) made by firing the inorganic binder 121 in the subsequent mixture firing step S4. When a number of scattering particles 122 are clustered into two layers, the thickness of the scattering particles 122 includes the total thickness of the two layers of the clusters.

In other words, it is necessary to control the coating thickness of the mixture in the mixture coating step S2 so that the cracks 141 can be formed in the matrix layer 140 due to the firing in the firing step S4 without additional processing. To control the shape of the cracks 141 formed without additional processing, it is necessary to control the composition and concentration of the mixture 120 in the mixture preparation step S1.

In addition, in the mixture coating step S2, the mixture 120 is applied to the base substrate 110 by wet coating and then is dried.

When the light extraction substrate (100 in FIG. 9) manufactured according to the exemplary embodiment is used in the OLED device (10 in FIG. 9), the base substrate 110 coated with the mixture 120 is disposed in a front portion of the OLED device 10, i.e. a location in which light generated by the OLED contacts the ambient air, to allow the light to exit while functioning as an encapsulation substrate to protect the OLED from the external environment. The base substrate 110 may be any transparent substrate having superior light transmittance and excellent mechanical properties. For example, the base substrate 110 may be formed from a polymeric material, such as a thermally or ultraviolet (UV) curable organic film. Alternatively, the base substrate 110 may be formed from chemically strengthened glass, such as soda-lime glass (SiO2-CaO—Na2O) or aluminosilicate glass (SiO2-Al2O3-Na2O). When the OLED device 10 including the light extraction substrate 100 according to the exemplary embodiment is used in lighting equipment, the base substrate 110 may be formed from soda-lime glass. The base substrate 110 may also be a metal oxide substrate or a metal nitride substrate. Alternatively, the base substrate 110 according to the exemplary embodiment may be a flexible substrate, more particularly, a thin glass sheet having a thickness of 1.5 mm or less. The thin glass sheet may be manufactured using a fusion process or a floating process.

Figure 3:
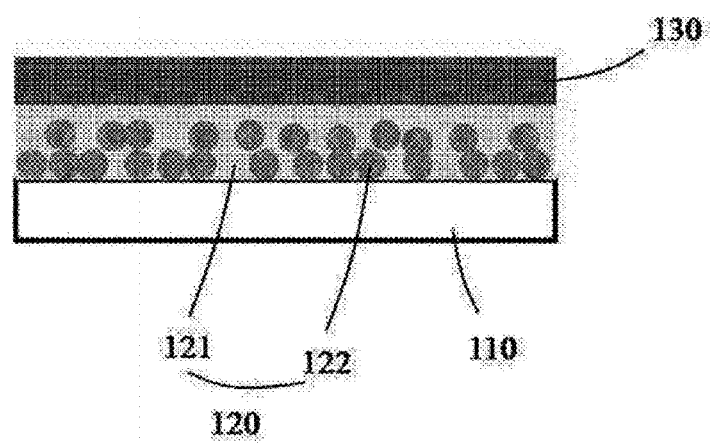

In subsequence, as illustrated in FIG. 3, the buffer layer forming step S3 is a step of forming a buffer layer 130 by coating the mixture 120 with an inorganic material, the mixture 120 being applied to the top surface of the base substrate 110 in the mixture coating step S2. The buffer layer 130 is a layer to be removed to form a first electrode (150 in FIG. 7) in the first electrode forming step S5 after the firing step S4. In this regard, the buffer layer 130 is required to be formed from an inorganic material that can withstand high-temperature heat treatment in the firing step S4 and can be easily etched in the first electrode forming step S5. Thus, an inorganic material, such as ZnO, may be used for the buffer layer 130 in the buffer layer forming step S3. Although the base substrate 110 can be coated with ZnO by dry coating or wet coating in the buffer layer forming step S3, wet coating followed by drying may be performed in terms of the cost and processing.

Figure 4:
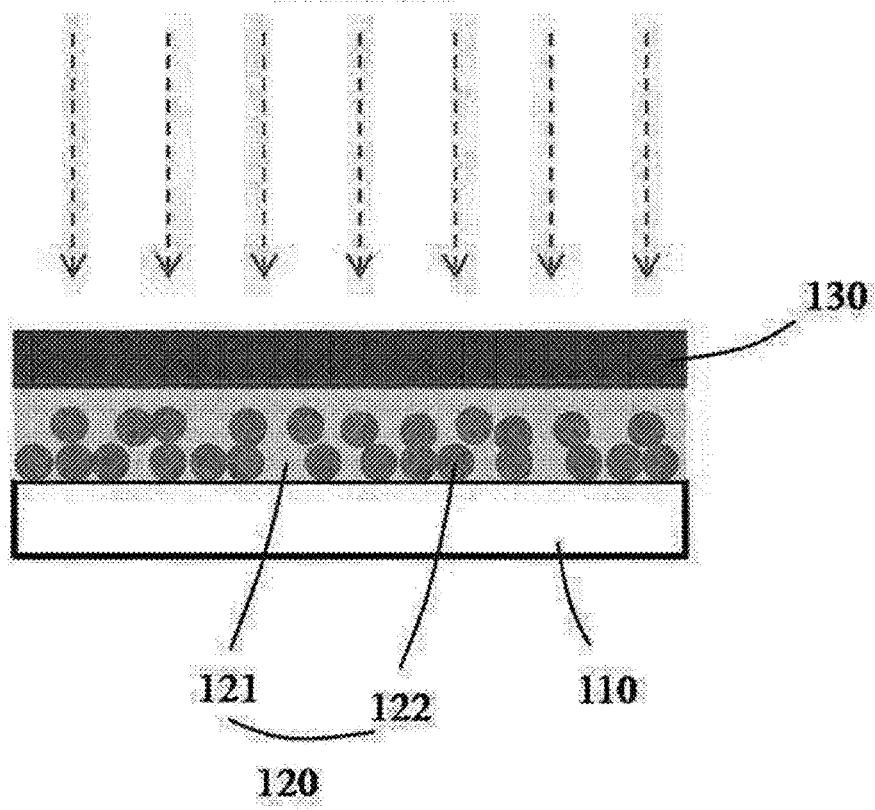

Afterwards, as illustrated in FIG. 4, the firing step S4 is a step of firing the mixture 120 and the buffer layer 130, subsequently layered on the base substrate 110. In addition, the firing step S4 is a step of forming the matrix layer (140 in FIG. 5), in which the number of scattering particles 122 having a different refractive index are dispersed, on the base substrate 110 by firing the mixture 120.

Figure 5:
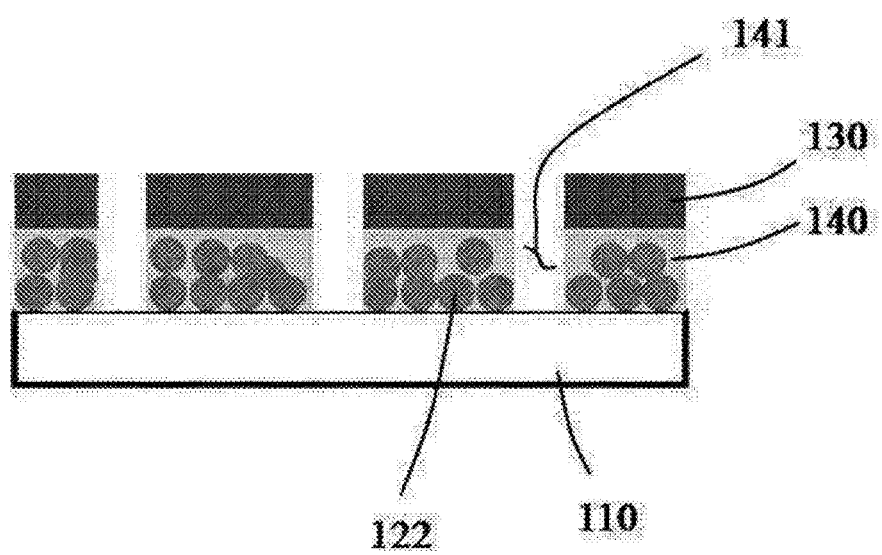

In the mixture firing step S4 according to the exemplary embodiment, the mixture 120 can be fired at a temperature of 400° C. to 800° C. When the mixture 120 is fired in this temperature range, during the contraction of the mixture 120 and the buffer layer 130, the cracks 141 are formed in the matrix layer 140 due to the different CTE of the base substrate 110 to that of the mixture 120 and that of the buffer layer 130, as illustrated in FIG. 5. When the light extraction substrate (100 in FIG. 9) manufactured according to the exemplary embodiment is used in the OLED device (10 in FIG. 9), the cracks 141 formed in the matrix layer 140 can scatter light emitted by the OLED, i.e. act to further complicate or diversify paths for light emitted by the OLED. In addition, according to the exemplary embodiment, the cracks 141 provide spaces in which the first electrode (150 in FIG. 7) is to be formed to function as an auxiliary electrode of the OLED device 10, which will be described in more detail later.

The cracks 141 are formed in the direction from the surface of the buffer layer 130 toward the base substrate 110. Portions or all of the cracks 141 may be formed to expose the base substrate 110 to the surface of the buffer layer 130. In addition, the cracks 141 may be formed between the number of scattering particles 122 or between the clusters of several scattering particles 122. In addition, the cracks 141 may be formed into a random network structure having minute line widths, since the composition and concentration of the mixture 120 are adjusted in the mixture preparation step S1.

In addition, a number of voids (not shown) having irregular shapes may be formed within the matrix layer 140 while the mixture 120 is being fired in the mixture firing step S4. In the case of the matrix layer 140 having a haze value of 60%, manufactured according to the exemplary embodiment, i.e. the matrix layer 140 in which, for example, the number of scattering particles 122 having the core-shell structure are dispersed in a single layer, the area of the number of voids (not shown) formed within the matrix layer 140 may range from 2.5% to 10.8% of the area of the matrix layer 140. Like the scattering particles 122 and the cracks 141, the number of voids (not shown) scatter light emitted by the OLED along a variety of paths, thereby contributing to improvements in the light extraction efficiency of the OLED device 10. In this case, the light extraction efficiency may increase with increases in the area of the number of voids (not shown) formed within the matrix layer 140. In addition, increases in the voids (not shown) formed within the matrix layer 140 can reduce the amount of scattering particles 122 used by an amount equal to the amount of the voids, thereby reducing the manufacturing cost.

Figure 6:
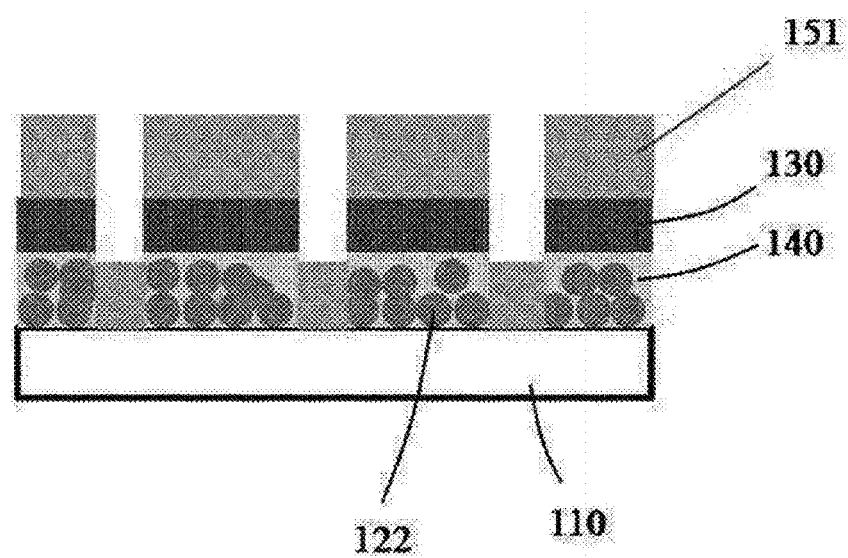
Figure 7:
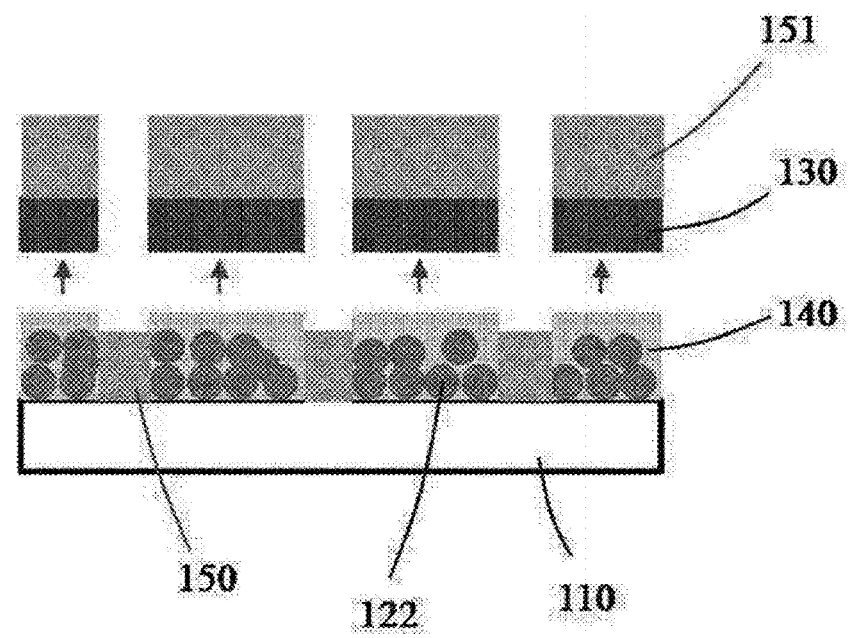

Afterwards, as illustrated in FIGS. 6 and 7, the first electrode forming step S5 is a step for forming the first electrode 150 from metal 151 in the cracks 141 formed in the matrix layer 140 and the buffer layer 130 during the firing of the mixture 120 in the firing step S4. In the first electrode forming step S5, the metal 151 is first deposited within the cracks 141 and on the buffer layer 130 to form the first electrode 150 to be used as an auxiliary electrode of the OLED device 10 having a large area in the case of fabricating the OLED device 10. The metal 151 may be one metal selected from a candidate group consisting of Cu, Al, and Ag, in which Ag or Al having a high degree of reflectivity may be used in terms of improvements in the light extraction efficiency of the OLED device 10. Although a conductive metal oxide, such as indium tin oxide (ITO), may be deposited in place of the metal 151, a metal material may be used in terms of sheet resistance.

Subsequently, the buffer layer 130 is etched. Although the buffer layer 130 may be etched by dry etching and wet etching, wet etching may be easier in several aspects of the process, including the manufacturing of the light extraction substrate 100 having a large area for the OLED device 10 having a large area. Here, an etching solution available for wet etching on the buffer layer 130 must not etch the metal 151 or must have a very low etching rate for the metal 151 compared to the buffer layer 130, such that selective etching can be performed. For example, in the case in which ZnO is used for the buffer layer 130 and Al is used for the metal layer 151, the use of HNO3 as the etching solution for the buffer layer 130 can realize selective etching of the buffer layer 130.

When the buffer layer 130 is etched as described above, portions of the metal 151 deposited on the buffer layer 130 are removed by liftoff, while the remaining portions of the metal 151 deposited within the cracks 141 may reside in the form of gap-fills, thereby forming the first electrode 150. According to the exemplary embodiment, the first electrode 150 is formed by filling the cracks 141, which are formed without additional processing. This can consequently form the cracks 141 in a simpler manner than conventional photolithographic processing for the auxiliary electrode of the OLED device, thereby reducing processing cost for the OLED device (10 in FIG. 9) compared to the conventional process. In addition, in the case in which the first electrode 150 is formed by filling the cracks 141, the use of the light extraction substrate 100 manufactured according to the exemplary embodiment in the OLED device 10 increases probability of light, wave-guided sideways from the inside of the matrix layer 140, to arrive at and be reflected from the first electrode 150, the auxiliary electrode formed from metal. This can consequently disturb a waveguide mode, thereby leading to an improvement in the light extraction efficiency.

The cracks 141 formed with the random network structure have an insignificant width of 100 nm to 300 nm and a height only ranging from 200 nm to 500 nm. The matrix layer 140 including the cracks 141 is optically transparent, with the sizes of the cracks only ranging from several micrometers to tens of micrometers. When the first electrode 150 is formed by filling the cracks 141, the widths of the first electrode 150 only range from several micrometers to tens of micrometers. Even in the case in which the matrix layer 140 has a large area according to the large OLED device 10, the uniformity of sheet resistance can be obtained.

Figure 8:
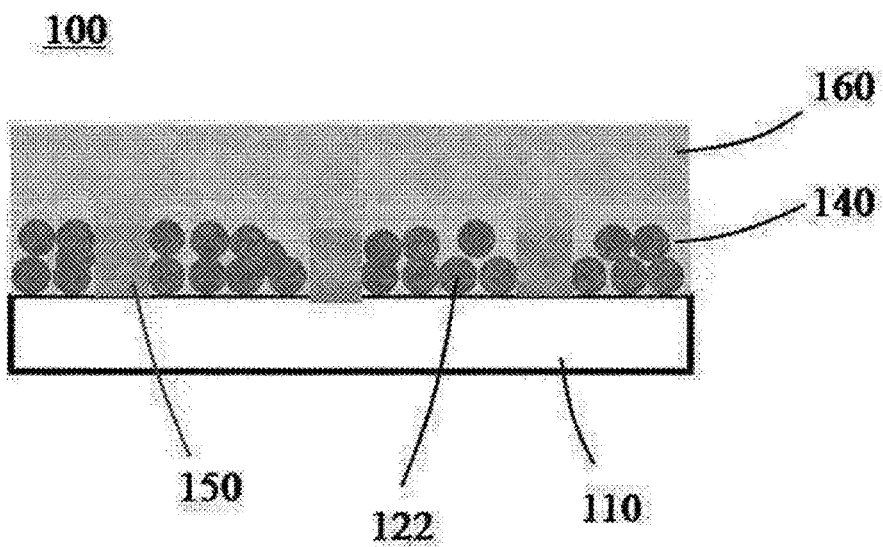

Afterwards, as illustrated in FIG. 8, the second electrode forming step S6 is a step of forming a second electrode 160 on the first electrode 150 to be electrically connected to the first electrode 150, the second electrode 160 being supposed to function as a main transparent electrode of the OLED device 10. In the second electrode forming step S6, the second electrode 160 can be formed by depositing a conductive metal oxide, such as ITO, or depositing a conductive polymer, such as PEDOT:PSS. In the second electrode forming step S6, the second electrode 160 is formed to cover the surfaces of the first electrode 150 and the matrix layer 140. When the second electrode 160 is formed in this manner, the surface of the matrix layer 140, the roughness of which is increased by the occurrence of the cracks 141, can be planarized. In the related art, for surface planarization of the matrix layer abutting the transparent electrode of the OLED device, a separate planarization layer is formed between the transparent electrode and the matrix layer. In contrast, according to the exemplary embodiment, the second electrode 160 functions not only as the transparent electrode of the OLED device 10, but also as the planarization layer of the related art, such that additional planarization processing can be omitted. According to the exemplary embodiment, forming the second electrode 160 as described above can simplify processing and reduce costs.

When the second electrode forming step S6 as described above is completed, the light extraction substrate 100 for an OLED according to the exemplary embodiment is manufactured.

Figure 9:
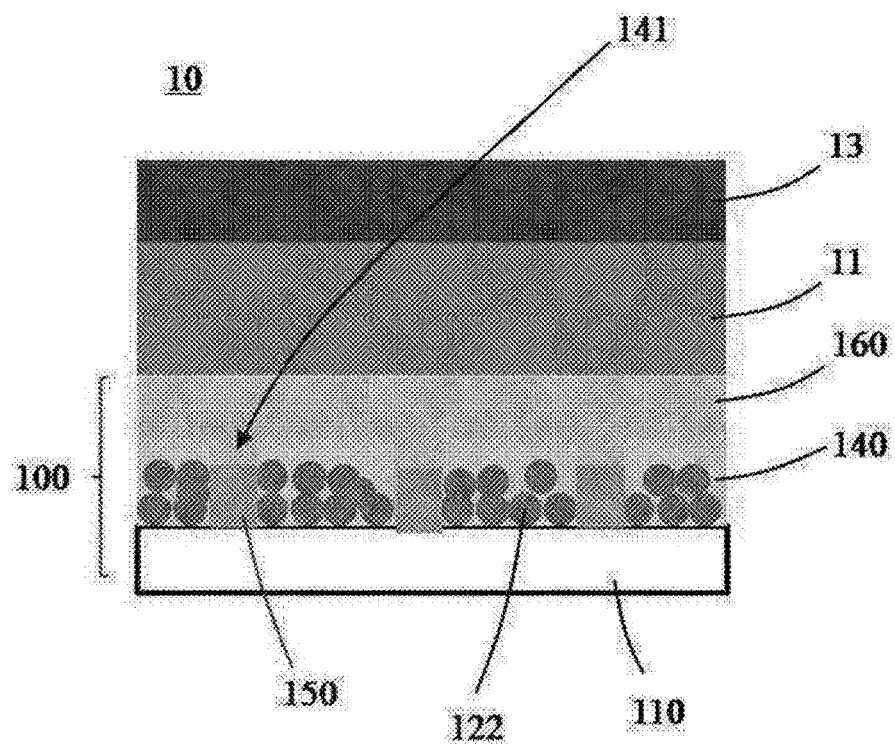
FIG. 9 is a cross-sectional view schematically illustrating an OLED device including the light extraction substrate for an OLED device manufactured according to the exemplary embodiment.

As illustrated in FIG. 9, the light extraction substrate 100 manufactured by the above-described process is disposed in a portion of the OLED device 10 to function as an optical functional substrate to improve the light extraction efficiency of the OLED device 10. Here, the matrix layer 140 having the cracks 141 and the number of scattering particles 122 and the number of voids (not shown) dispersed within the matrix layer 140 form an internal light extraction layer of the OLED device 10. Based on the different refractive indices of the matrix layer 140, the scattering particles 122, and the voids (not shown), the internal light extraction layer can provide a complicated scattering structure for causing light emitted by an organic light-emitting layer 11 to be sharply scattered and diversify scattering paths for the light, thereby significantly improving the light extraction efficiency of the OLED device 10. In addition, the first electrode 150 formed by filling the cracks 141 having the random network structure and the second electrode 160 overlying and electrically connected to the first electrode 150 are used as the auxiliary electrode and the main electrode of the OLED device 10, thereby improving the luminance uniformity of the OLED device 10 having a large area and allowing the OLED device 10 to operate at a low voltage.

In addition, the OLED of the OLED device 10 has a multilayer structure of an anode, the organic light-emitting layer 11, and a third electrode 13 sandwiched between the light extraction substrate 100 according to the exemplary embodiment and another substrate (not shown) facing the light extraction substrate 100 for encapsulation of the OLED. The anode, the main electrode of the OLED device 10, is a transparent electrode, and the second electrode 160 of the light extraction substrate 100 according to the exemplary embodiment serves as the main electrode. In addition, the third electrode 13 is a cathode of the OLED device 10. The third electrode 13 may be a metal thin film formed from Al, Al:Li, or Mg:Ag that has a smaller work function to facilitate electron injection. Although not specifically shown, the organic light-emitting layer 11 may include a hole injection layer, a hole transport layer, an emissive layer, an electron transport layer, and an electron injection layer that are sequentially stacked on the second electrode 160.

According to this structure, when a forward voltage is induced between the second electrode 160 and the third electrode 13, electrons migrate from the third electrode 13 to the emissive layer through the electron injection layer and the electron transport layer, while holes migrate from the second electrode 160 to the emissive layer through the hole injection layer and the hole transport layer. The electrons and the holes that have migrated into the emissive layer recombine with each other, thereby generating excitons. When these excitons transit from an excited state to a ground state, light is emitted. The brightness of the emitted light is proportional to the amount of current flowing between the second electrode 160 and the third electrode 13.

When the OLED device 10 is a white OLED device used in lighting equipment, the organic light-emitting layer may have, for example, a multilayer structure including a high-molecular light-emitting layer that emits blue light and a low-molecular light-emitting layer that emits orange-red light. In addition, a variety of other structures that emit white light may be used.

According to the exemplary embodiment, the organic light-emitting layer 11 may have a tandem structure. Specifically, a plurality of organic light-emitting layers 11 alternating with interconnecting layers (not shown) may be provided.

As set forth above, in the method of manufacturing a light extraction substrate for an OLED device according to the exemplary embodiment, the light extraction substrate 100 is manufactured in a series of processes of forming a random network structure by controlling the shapes of the cracks 141 formed, without additional processing, by the contraction of the mixture 120 in the firing operation for forming the matrix layer 140 and then forming the first electrode 150 serving as the auxiliary electrode of the OLED device in the cracks 141. According to the exemplary embodiment, the light extraction substrate 100 can be manufactured by a simpler process than in the related art, thereby reducing process costs compared to the related art.

In addition, when the light extraction substrate 100 manufactured as described above is used in the OLED device 10, it is possible to improve the light extraction efficiency and luminance uniformity of the OLED device 10 and enable the OLED device 10 to operate at @ a low voltage. Accordingly, the present disclosure is applicable to the OLED device 10 having a large area.

The foregoing descriptions of specific exemplary embodiments of the present disclosure have been presented with respect to the drawings. They are not intended to be exhaustive or to limit the present disclosure to the precise forms disclosed, and obviously many modifications and variations are possible for a person having ordinary skill in the art in light of the above teachings.

It is intended therefore that the scope of the present disclosure not be limited to the foregoing embodiments, but be defined by the Claims appended hereto and their equivalents.

The invention claimed is:

1. A method of manufacturing a light extraction substrate for an organic light-emitting device, the method comprising:
   preparing a mixture by mixing a number of scattering particles with an inorganic binder;
   coating a base substrate with the mixture;
   forming a buffer layer by coating the mixture on the base substrate with an inorganic material;
   firing the mixture and the buffer layer;
   forming a first electrode from metal in cracks formed in the mixture and the buffer layer during the firing; and
   forming a second electrode on the first electrode to be electrically connected to the first electrode.

2. The method of claim 1, wherein the number of scattering particles used in preparing the mixture comprise particles having a difference in refractive index of 0.3 or greater than the inorganic binder.

3. The method of claim 1, wherein the number of scattering particles used in preparing the mixture comprise one metal oxide or a combination of two or more metal oxides selected from a candidate group consisting of $SiO_2$, $TiO_2$, ZnO, and $SnO_2$.

4. The method of claim 1, wherein, in preparing the mixture, scattering particles respectively comprising a core and a shell surrounding the core, the shell having a refractive index different from a refractive index of the core, are used as the number of scattering particles or to form portions of the number of scattering particles.

5. The method of claim 4, wherein, in preparing the mixture, the scattering particles respectively comprising a hollow core are used as the number of scattering particles or to form portions of the number of scattering particles.

6. The method of claim 1, wherein the inorganic material forming the buffer layer comprises ZnO.

7. The method of claim 1, wherein forming the first electrode comprises:
   depositing metal within the cracks and on the buffer layer; and
   etching the buffer layer.

8. The method of claim 7, wherein the deposited metal comprises one metal selected from a candidate group consisting of Cu, Al, and Ag.

9. The method of claim 1, wherein firing the mixture forms a number of voids having irregular shapes within the matrix layer.

10. A light extraction substrate for an organic light-emitting device, comprising:
    a base substrate;
    a matrix layer disposed on the base substrate;
    a number of scattering particles dispersed within the matrix layer;
    a first electrode filling cracks formed in the matrix layer and formed from metal; and
    a second electrode disposed on the matrix layer and the first electrode.

11. The light extraction substrate of claim 10, wherein the number of scattering particles comprise particles having a difference in refractive index of 0.3 or greater than the matrix layer.

12. The light extraction substrate of claim 11, wherein at least portions of the number of scattering particles respectively comprise a core and a shell surrounding the core, the shell having a refractive index different from a refractive index of the core.

13. The light extraction substrate of claim 12, wherein the cores comprise voids.

14. The light extraction substrate of claim 10, further comprising voids having irregular shapes disposed within the matrix layer.

15. The light extraction substrate of claim 10, wherein the cracks are disposed between the number of scattering particles or between clusters of several scattering particles of the number of scattering particles.

16. The light extraction substrate of claim 10, wherein at least portions of the cracks expose the base substrate to a surface of the matrix layer.

17. The light extraction substrate of claim 10, wherein the second electrode is a transparent electrode functioning as a main electrode of the organic light-emitting device, the first electrode functions as an auxiliary electrode of the organic light-emitting device, and the matrix layer and the number of scattering particles function as an internal light extraction layer of the organic light-emitting device.

18. An organic light-emitting device comprising the light extraction substrate as claimed in claim 10 in a location through which generated light exits.

* * * * *